United States Patent [19]

Lo

[11] Patent Number: 5,291,200
[45] Date of Patent: Mar. 1, 1994

[54] METHOD FOR MEASURING FREQUENCY MODULATION RATE CHARACTERISTICS FOR A SWEPT FREQUENCY SIGNAL

[75] Inventor: Pei-hwa Lo, Ramsey, N.J.

[73] Assignee: AlliedSignal Inc., Morris Township, Morris County, N.J.

[21] Appl. No.: 932,822

[22] Filed: Aug. 20, 1992

[51] Int. Cl.$^5$ ............................................. G01S 7/40
[52] U.S. Cl. ..................... 342/13; 342/174; 342/195; 342/200
[58] Field of Search ................. 375/45, 62; 371/16.5; 342/13, 174, 200, 173, 195

[56] References Cited

U.S. PATENT DOCUMENTS

| | | | |
|---|---|---|---|
| 3,754,101 | 8/1973 | Daspit et al. | 370/11 |
| 3,887,919 | 6/1975 | Christensen et al. | 342/19 |
| 4,553,221 | 11/1985 | Hyatt | 364/724.05 |
| 4,686,655 | 8/1987 | Hyatt | 367/59 |
| 5,053,983 | 10/1991 | Hyatt | 364/724.03 |
| 5,179,383 | 1/1993 | Raney et al. | 342/25 |

Primary Examiner—John B. Sotomayor
Attorney, Agent, or Firm—Howard G. Massung

[57] ABSTRACT

A method for characterizing frequency modulation rate parameters for a swept frequency signal is based on zero crossing counting and digital signal processing. The method is easy to implement and does not require batch processing so as to be suitable for real time tracking of frequency variations in a variety of applications.

7 Claims, 2 Drawing Sheets

METHOD FOR MEASURING FREQUENCY MODULATION RATE CHARACTERISTICS FOR A SWEPT FREQUENCY SIGNAL

BACKGROUND OF THE INVENTION

Current methods for measuring frequency modulation rate characteristics for a swept frequency signal (characterizing the swept frequency signal) use analog frequency demodulation such as, for example, frequency discrimination. However, bandwidth, linearity and accuracy when using analog frequency demodulation are limited. Additionally, analog frequency demodulation arrangements are difficult to calibrate and to maintain. They are also bulky, cumbersome and functionally inflexible.

Recently, characterizing swept frequency signals using high speed digital counting has been considered. However, digital counting requires sophisticated zero crossing (level crossing) timing measurements. This results in bulky, cumbersome and expansive apparatus which is not feasible for many portable applications, such as instrument-on-a-card (IAC) applications. In addition, digital counting is not adequate nor reliable when the received signal is noisy.

The present invention overcomes the aforenoted disadvantages.

SUMMARY OF THE INVENTION

This invention contemplates a method for measuring frequency modulation rate characteristics for a swept frequency signal wherein filtering is used to insure the accuracy of the measurement. Due to the computational inaccuracy of the filtering, the error resulting from the signal tracking process can be too large for reliably monitoring the measurement error. This can occur, for example, when tracking a linear frequency sweeping signal over a long period. One method to overcome this problem is to periodically re-initialize the estimation process ($\hat{A}$ vector). Another method for accomplishing the desired result is to avoid long tracking periods by discarding very old filtered information. This will be recognized as equivalent to embedding a fading factor into the filtering step of the method such that only the most recent data is used to measure the tracking error. While both of the techniques aforementioned work well, the latter is more computationally efficient and, hence, is preferable.

When using the method disclosed herein, it is important to know how many zero crossing samples are needed to initialize the estimation process ($\hat{A}$ vector). Depending on the characteristics of the measured signal, the proper number of samples will vary. However, this number must be such to insure the validity of a piece-wise linear frequency sweeping model. When a long linear frequency sweeping signal is to be measured, more zero crossing samples are used to establish an accurate initial estimation. Otherwise, a small number of samples are used, as will be readily understood.

The method of the invention can be implemented using timing and counting. Instead of digitizing the signal, timing the zero crossing and counting and tracking the time elapsed between two zero crossing samples are used. Stored time and counting information is directed to a computer for performing the frequency modulation rate (FMR) measurements. It will be noted that using timing and counting as aforementioned significantly increases the measurement frequency bandwidth.

DETAILED DESCRIPTION OF THE INVENTION

Figure 1:
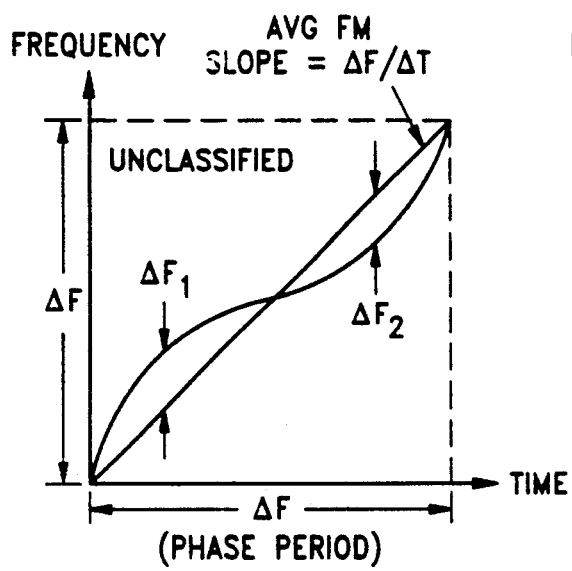
FIGS. 1 and 2 are graphical representations illustrating frequency modulation rate (FMR) peak-to-peak deviation.
Figure 2:
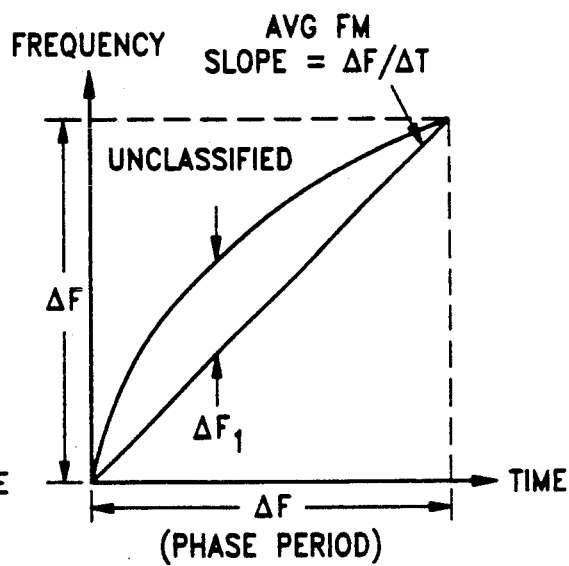

In testing Doppler radar transmitter systems, advanced electronic warfare (EW) systems and electronic counter measure (ECM) systems, it is often desired to measure swept frequency characteristics. This is commonly referred to as frequency modulation rate (FMR) measurement. Typical examples of FMR measurement are illustrated in FIGS. 1 and 2. The parameters of interest include period, peak-to-peak frequency deviation and frequency tolerance.

Since high speed digitizers are used in almost all test and measurement environments, it has been determined to be economical to develop an algorithm to perform FMR measurements and the present invention is directed to this end.

A digitized FMR signal S(t) can be expressed as:

$$S(t) = \text{SIN}\,[W(t)\,t + \phi_0], \tag{1}$$

where:

$t = nT$, $n = 0,1,2,\ldots$, and T is the sampling period. $\phi_0$ is an initial phase.

Using piece-wise linearizing, the modulating signal W(t) can be approximated by a linear function. This assumption is valid when the approximation interval is much smaller than the sweep interval. For a small sweep interval, the signal in (1) can be approximated by:

$$S(t) = \text{SIN}\,(A_0 + A_1 t + A_2\, t^2), \tag{2}$$

where:

$A_0 = \phi_0$
$A_1 = W_c$
$A_2 = (W_x - W_c) / T_x$, where $T_x$ is the approximation time interval; $W_c$ is the start frequency; and $W_x$ is the end frequency.

Acquiring all zero crossing points ($t_i$, $i = 0, 1, 2 \ldots$) of (2), the following equation is obtained:

$$TA + N = K, \tag{3}$$

where:

$$T = \begin{bmatrix} 1 & t_1 & t_1^2 \\ 1 & t_2 & t_2^2 \\ \vdots & \vdots & \\ 1 & t_n & t_n^2 \end{bmatrix}$$

$$A = \begin{bmatrix} A_0 \\ A_1 \\ A_2 \end{bmatrix}$$

$$K = \begin{bmatrix} 0 \\ \pi \\ \vdots \\ (n-1)\pi \end{bmatrix}$$

It is noted that T is a measurement vector, A is a sweeping characteristic vector, K is a constant and N is a noise vector. Noise is caused by zero crossing measurement errors, digitization errors and signal distortions resulting from an analog front-end system. The task is to obtain a good estimation (Â) of the A (sweeping characteristics) vector. The solution of the least mean square estimation of Â is given as follows:

$$\hat{A} = (T^t T)^{-1} T^t K \quad (4)$$

The superscript t represents the transposition of the matrix T. The estimation of Â is valid only if frequency is swept linearly. However, in certain practical FMR measurement applications, frequency components are not swept linearly. As a result, the piece-wise linear frequency sweeping assumption has to be monitored and tracked closely. An updated Â must be generated when the frequency sweeping curve deviates from (with specified measurement accuracy) the predicted trajectory. An effective method to track Â is to use Kalman filtering. To obtain a recursive update for Â, it is assumed that an additional zero crossing timing measurement t(N+1) is made. Updated [Â A(N+1)] can be written as:

$$\hat{A}(N+1) = \hat{A}(N) + G(N+1)[K(N+1) - t(N+1)\hat{A}(N)] \quad (5)$$

where:
$G(N+1) = P(N+1) T^T(N+1);$
$P(N+1) = H [T(N+1) P(N)]^T [T(N+1) P(N)];$
$H = 1 / [1 + T(N+1) P(N) T^T(N+1)];$ and
$P(N) = [T^T(N) T(N)]^{-1}$ The term G is the Kalman filter gain. The bracketed expression in equation (5) is the estimation error vector.

When the estimation error is small, the linear frequency sweeping assumption is valid. Otherwise, measurement of Â must be re-initialized to insure proper FMR measurement accuracy.

Figure 3:
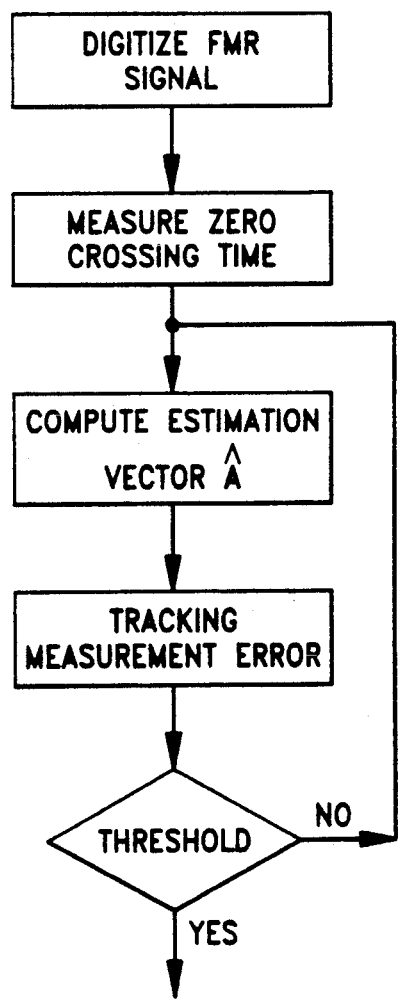
FIG. 3 is a flow chart illustrating an algorithm for the herein disclosed method.

A Flow diagram of an FMR measurement algorithm in accordance with the present invention is illustrated in FIG. 3. Thus, the algorithm involves sampling the zero crossings of a frequency modulation rate signal. This can be achieved by digitizing the frequency modulation rate signal and measuring the zero crossing times of the digitized signal. The sampled zero crossings are used for initially estimating the sweeping characteristics of the frequency modulation rate signal. The error of the estimate is tracked and the estimate is updated if the error is beyond a predetermined threshold. The updated estimate is used for measuring the frequency modulation rate characteristics.

In implementing the algorithm illustrated in FIG. 3 it will be realized that signals used in radar transmitter, EW and ECM systems are in a very high frequency band. To measure FMR characteristics utilizing digital signal processing as contemplated by the present invention, the received signal must be frequency down-converted to an IF signal.

The FMR peak deviation is defined as the maximum frequency swing of the received signal. To avoid aliasing error, the sampling rate must be at least twice the maximum frequency swing of the signal. However, using the method of the present invention to measure FMR peak deviation, the sampling frequency must be at least five times the maximum frequency swing. This is necessary due to the requirement for measuring zero crossing time. Typically, zero crossing time is estimated by the linear interpolation method. When the number of samples taken per sinusoidal wave is less than five, the interpolation error grows significantly. This usually results in unsatisfactory measurement accuracy.

One intuitive way for reducing the interpolation error is to use more suitable interpolating such as sine interpolating. Experience indicates that using various types of interpolating has not significantly improved the zero crossing timing measurement accuracy with a reduced sampling rate. In addition, the number of calculations increase when using more complicated interpolation schemes. Accordingly, and from a practical point of view, an oversampling of at least five times is preferable.

Another factor which affects the accuracy of the zero crossing time measurement is the quantization error of the digitizer. It has been found that an eight bit digitizer is adequate for FMR measurement applications.

The phase period (FIGS. 1 and 2) is defined as one complete cycle of a frequency swing. Usually, when measuring FMR characteristics, a timing signal which indicates the start of a phase period can be obtained. Depending on a specific application, the data length or trigger delay of the digitizer must be properly adjusted. This is required to insure that a complete cycle of frequency swing is measured.

In the method of the present invention, a Kalman filter is used to insure the measurement accuracy. However, due to the computational accuracy of the Kalman filter, the error resulting from the tracking process can be too large to reliably monitor the measurement error. For example, this can happen when tracking a long period of linear frequency sweeping signal. One method to overcome this problem is to periodically re-initialize the estimation process (Â). Another method is to avoid a long tracking process by discarding very old information carried in the Kalman filter. This is equivalent to embedding a fading factor into the Kalman filter such that only the most recent data is used to perform the measurement error tracking. Both above-mentioned methods work well in the contemplated applications. However, the latter method is more computationally efficient than the first.

The method of the present invention can be implemented via timing-counting. Instead of digitizing the signal as illustrated in the flow diagram of FIG. 3, timing which registers the zero crossing time and counting which tracks the elapsed time between two zero crossing samples can be used. The stored timer and counter information can be applied to a computer to perform FMR measurements.

Figure 4:
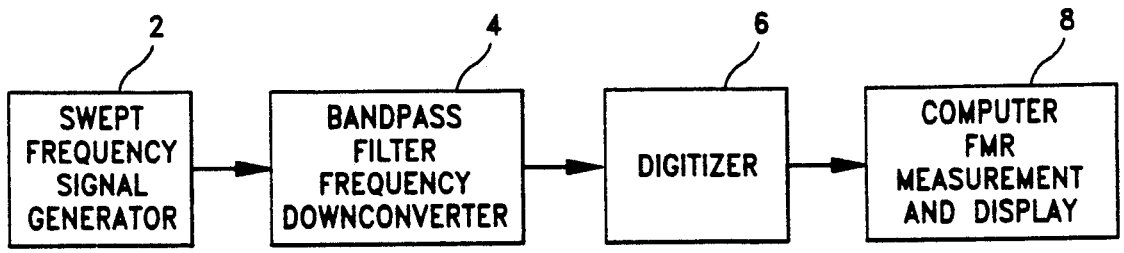
FIG. 4 is a block diagram illustrating an implementation of the method.
Figure 5:
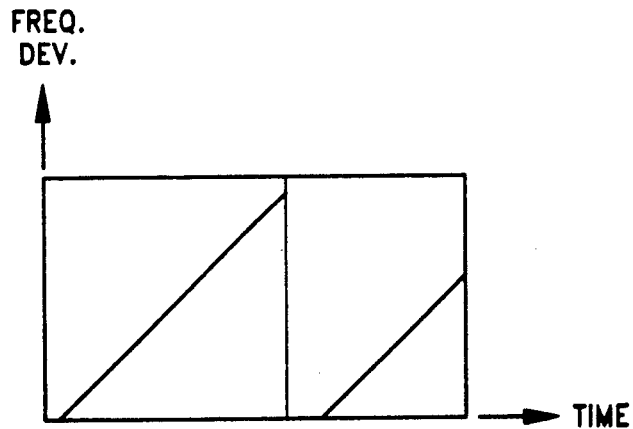
FIG. 5 is a graphical representation illustrating the measurement of a linear swept signal according to the invention.
Figure 6:
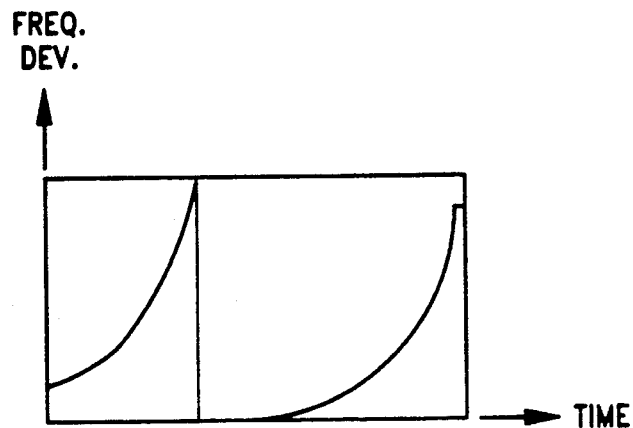
FIG. 6 is a graphical representation illustrating the measurement of a logarithmic swept signal according to the invention.

With reference to the implementation of the invention shown in FIG. 4, frequency swept signals (RF) are generated by a signal generator 2. The RF signals are down-converted to IF signals via a down-converter 4. The IF signals are sampled by a digitizer 6. The digitized signals are transferred to a computer 8 to perform the FMR measurements. Measurement of a linear swept signal is thus performed. The result of this measurement is illustrated in FIG. 5. The measurement result of a logarithmic swept signal is demonstrated in FIG. 6.

Note that the estimation and measurement error tracking herein described can be used to accurately characterize various FMR parameters. Based on the results shown in FIGS. 5 and 6, all important FMR parameters such as period, peak-to-peak frequency deviation, fly-back time, frequency sweeping characteristics and tolerance can be precisely measured.

There has been herein described a method to measure FMR parameters. The method is based on zero crossing counting and digital signal processing. This method is easy to implement and is suitable for a variety of applications.

It is noted that the method does not require batch processing, and is therefore suitable for real time tracking of frequency variations in many EW and ECM systems.

Some application examples of the method of the invention include (1) measuring FM (frequency modulation) swept frequency signals using digitizer and computer (signal processor) methods; and (2) characterizing and tracking frequency deviation caused by Doppler effects such as in EW, ECM and sonar applications.

The practical importance of the invention will be realized when it is understood that the method described can significantly improve the accuracy of characterizing swept frequency signals and that the method can be implemented in real time and is usable in a noisy environment.

With the above description of the invention in mind, reference is made to the claims appended hereto for a definition of the scope of the invention.

What is claimed is:

1. A method for measuring frequency modulation rate characteristics for a swept frequency signal, comprising:
    sampling the zero crossings of a frequency modulation rate signal;
    using the sampled zero crossings for initially estimating the sweeping characteristics of the frequency modulation rate signal;
    tracking the error of the estimate;
    updating the estimate if the error is beyond a predetermined threshold; and
    using the updated estimate for measuring the frequency modulation rate characteristics.

2. A method as described by claim 1, wherein sampling the zero crossings of a frequency modulation rate signal includes:
    digitizing the frequency modulation rate signal; and
    measuring the zero crossing times of the digitized signal.

3. A method as described by claim 1, wherein sampling the zero crossings of the frequency modulation rate signal includes:
    timing the zero crossings of the frequency modulation rate signal; and
    counting and tracking the elapsed time between pairs of zero crossings.

4. A method as described by claim 1, wherein updating the estimate if the error is beyond a predetermined threshold includes:
    filtering the estimate using Kalman filtering.

5. A method as described by claim 4, including:
    avoiding long tracking periods by discarding all filtered estimates so that only the most recent estimates are used for determining if the tracking error is beyond the predetermined threshold.

6. A method as described by claim 1, wherein sampling the zero crossings of a frequency modulation rate signal includes:
    varying the number of samples for insuring the validity of a piece-wise linear frequency model.

7. A method as described by claim 6, wherein varying the number of samples includes:
    increasing the number of samples when the signal measured is a long linear frequency sweeping signal.

* * * * *